(12) United States Patent
Chang et al.

(10) Patent No.: US 11,365,117 B2
(45) Date of Patent: Jun. 21, 2022

(54) MEMS DEVICE AND MANUFACTURING METHOD OF THE SAME

(71) Applicant: Industrial Technology Research Institute, Hsinchu (TW)

(72) Inventors: Heng-chung Chang, Taichung (TW); Jhih-Jie Huang, Hsinchu County (TW); Chih-Ya Tsai, Taichung (TW); Jing-Yuan Lin, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 205 days.

(21) Appl. No.: 16/726,025

(22) Filed: Dec. 23, 2019

(65) Prior Publication Data

US 2021/0188626 A1    Jun. 24, 2021

(51) Int. Cl.
*B81B 7/00* (2006.01)
*B81C 1/00* (2006.01)

(52) U.S. Cl.
CPC ........ *B81B 7/0041* (2013.01); *B81C 1/00293* (2013.01); *B81B 2203/0315* (2013.01); *B81B 2203/04* (2013.01); *B81B 2207/07* (2013.01); *B81B 2207/09* (2013.01)

(58) Field of Classification Search
CPC .................................................. B81B 7/0041
See application file for complete search history.

(56) References Cited

U.S. PATENT DOCUMENTS

| | | |
|---|---|---|
| 5,567,650 A | 10/1996 | Straight et al. |
| 5,933,756 A | 8/1999 | Fuse |
| 6,407,002 B1 | 6/2002 | Lin et al. |
| 6,541,864 B1 | 4/2003 | Fukuzumi |
| 6,875,681 B1 | 4/2005 | Bohr |

(Continued)

FOREIGN PATENT DOCUMENTS

| | | |
|---|---|---|
| CN | 109738109 A | 5/2019 |
| CN | 109841580 A | 6/2019 |

(Continued)

OTHER PUBLICATIONS

Candler, Rob N. "Encapsulation by Film Deposition," Handbook of Silicon Based MEMS Materials and Technologies, 2009, pp. 569-574, US.

(Continued)

*Primary Examiner* — Moazzam Hossain

(57) ABSTRACT

A MEMS device is provided. The MEMS device includes a substrate having at least one contact, a first dielectric layer disposed on the substrate, at least one metal layer disposed on the first dielectric layer, a second dielectric layer disposed on the first dielectric layer and the metal layer and having a recess structure, and a structure layer disposed on the second dielectric layer and having an opening. The opening is disposed to correspond to the recess structure, and the cross-sectional area at the bottom of the opening is smaller than the cross-sectional area at the top of the recess structure. The MEMS device also includes a packaging layer, and at least a portion of the packaging layer is disposed in the opening and the recess structure. The second dielectric layer, the structure layer, and the packaging layer define a chamber.

19 Claims, 11 Drawing Sheets

(56) References Cited

U.S. PATENT DOCUMENTS

| | | | |
|---|---|---|---|
| 6,982,475 | B1 | 1/2006 | MacIntyre |
| 7,084,028 | B2 | 8/2006 | Fukuzumi |
| 7,205,181 | B1 | 4/2007 | MacIntyre |
| 7,235,281 | B2 | 6/2007 | Rusu et al. |
| 7,585,744 | B2 | 9/2009 | Gogoi et al. |
| 8,847,400 | B2 | 9/2014 | Fujita et al. |
| 8,921,144 | B2 | 12/2014 | Dunbar, III et al. |
| 8,921,997 | B2 | 12/2014 | Shimooka et al. |
| 9,136,220 | B2 | 9/2015 | Uchiyama |
| 9,443,790 | B2 | 9/2016 | Fujita |
| 9,567,204 | B2 | 2/2017 | Hung et al. |
| 9,567,207 | B2 | 2/2017 | Tseng et al. |
| 9,576,904 | B2 | 2/2017 | Sandhu et al. |
| 9,704,798 | B2 | 7/2017 | Govindaraju et al. |
| 10,043,824 | B2 | 8/2018 | Lee et al. |
| 2009/0140146 | A1 | 6/2009 | Sogawa et al. |
| 2012/0199886 | A1 | 8/2012 | Horak et al. |
| 2012/0252221 | A1* | 10/2012 | De Brabander .... B81C 1/00103 438/736 |
| 2012/0256308 | A1 | 10/2012 | Helin |
| 2014/0070339 | A1 | 3/2014 | Marx et al. |
| 2015/0298170 | A1* | 10/2015 | Rothberg .............. H01L 21/768 257/416 |
| 2017/0129772 | A1* | 5/2017 | Cheng .................... B81B 7/008 |
| 2017/0267518 | A1 | 9/2017 | Kinugawa et al. |
| 2018/0175063 | A1 | 6/2018 | Lee et al. |
| 2020/0035641 | A1* | 1/2020 | Fountain, Jr. ........... H01L 24/08 |

FOREIGN PATENT DOCUMENTS

| | | |
|---|---|---|
| EP | 2236456 A1 | 10/2010 |
| TW | 201641415 A | 12/2016 |
| TW | 201736242 A | 10/2017 |

OTHER PUBLICATIONS

Sharma, Jaibir, et al. "Preparation of porous metal membrane by thermal annealing for thin film encapsulation," International Journal of Materials and Metallurgical Engineering, 2015, pp. 1092-1095, 2015, vol. 9, No. 9, US.

Taiwan Patent Office, Office Action, Patent Application Serial No. 109145665, dated Jul. 8, 2021, Taiwan.

* cited by examiner

MEMS DEVICE AND MANUFACTURING METHOD OF THE SAME

TECHNICAL FIELD

Embodiments of the present disclosure relate to a microelectromechanical system (MEMS) device and a manufacturing method of the same, and in particular they relate to a MEMS device with good sealing quality and a manufacturing method of the same.

BACKGROUND

Microelectromechanical system (MEMS) devices typically include mechanical components (e.g., fixing and/or movable components) to sense a physical condition (e.g., force, acceleration, pressure, temperature, or vibration) and electronic components to process electrical signals. Therefore, MEMS devices are often used as sensors and are widely used in applications such as automotive systems, inertial guidance systems, home appliances, protection systems for various devices, and many other industrial, scientific, and engineering systems.

Existing MEMS devices generally meet requirements, but they are not satisfactory in every respect. For example, when a MEMS device is used as a pressure sensor, it may be necessary to provide a sealed (air-tight) chamber, thus requiring good sealing quality. However, in order to achieve this, manufacturing problems may arise, including long processing times and complicated manufacturing processes.

SUMMARY

In some embodiments of the present disclosure, by providing a recess structure in the dielectric layer and an opening corresponding to the recess structure in the structure layer, a packaging layer (i.e., a structure for sealing holes) may be continuously and uniformly filled into the opening and the recess structure to complete sealing. The MEMS device and the manufacturing method thereof according to the embodiments of the present disclosure may effectively prevent the generation of sealing seams and hollow structures, thereby improving sealing quality and overall stability. In addition, no complicated process is required, which may effectively shorten the process time and reduce costs.

The embodiments of the present disclosure provide a MEMS device. The MEMS device includes a substrate having at least one contact. The MEMS device also includes a first dielectric layer disposed on the substrate. The MEMS device further includes at least one metal layer disposed on the first dielectric layer, and at least a portion of the metal layer electrically connected to the contact. The MEMS device includes a second dielectric layer disposed on the first dielectric layer and the metal layer and having a recess structure. The MEMS device also includes a structure layer disposed on the second dielectric layer and having an opening. The opening is disposed to correspond to the recess structure, and the cross-sectional area at the bottom of the opening is smaller than the cross-sectional area at the top of the recess structure. The MEMS device further includes a packaging layer, and at least a portion of the packaging layer is disposed in the opening and the recess structure. The second dielectric layer, the structure layer, and the packaging layer define a chamber.

The embodiments of the present disclosure also provide a manufacturing method of a MEMS device. The manufacturing method of the MEMS device includes providing a substrate having at least one contact. The manufacturing method of the MEMS device also includes forming a first dielectric layer on the substrate. The first dielectric layer has at least one through hole exposing a portion of a top surface of the contact. The manufacturing method of the MEMS device further includes forming at least one metal layer on the first dielectric layer. At least a portion of the metal layer is electrically connected to the contact. The manufacturing method of the MEMS device includes forming a second dielectric layer on the first dielectric layer and the metal layer. The second dielectric layer has a recess structure. The manufacturing method of the MEMS device also includes forming a sacrificial layer on the second dielectric layer and in the recess structure. The manufacturing method of the MEMS device further includes forming a structure layer on the second dielectric layer and the sacrificial layer. The manufacturing method of the MEMS device includes removing a portion of the structure layer to form an opening. The opening exposes the sacrificial layer in the recess structure. The manufacturing method of the MEMS device also includes removing the sacrificial layer to expose the recess structure. The cross-sectional area at the bottom of the opening is smaller than the cross-sectional area at the top of the recess structure. The manufacturing method of the MEMS device further includes forming a packaging layer. At least a portion of the packaging layer is formed in the opening and the recess structure, and the second dielectric layer, the structure layer, and the packaging layer define a chamber.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
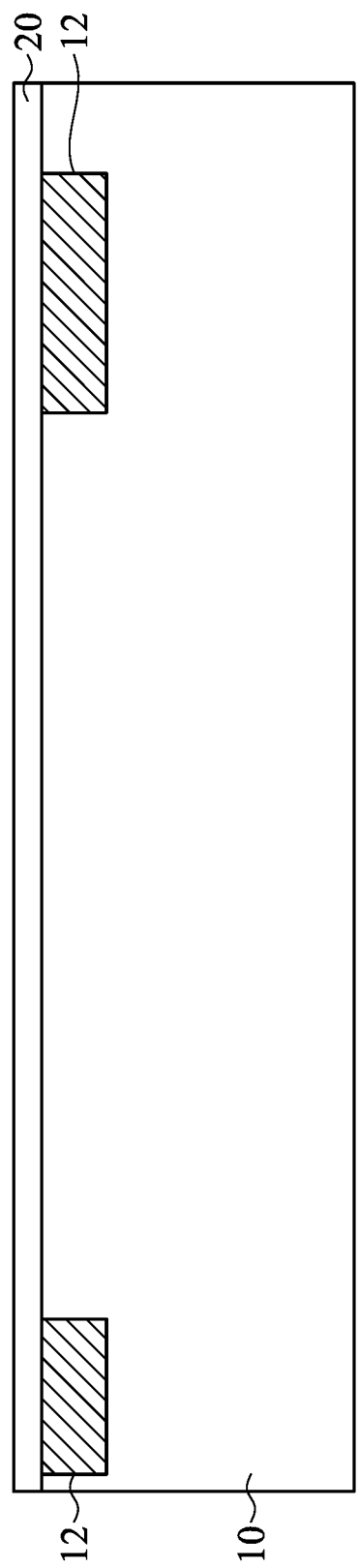
FIG. 1 is a cross-sectional view illustrating the MEMS device at one stage of manufacture according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional operations can be provided before, during, and after the method, and some of the operations described can be replaced or eliminated for other embodiments of the method.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood through one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

Different embodiments disclosed below may repeat reference numerals and/or letters in the various examples. This repetition is for the purpose of simplicity and clarity and does not in itself dictate a relationship between the various embodiments and/or configurations discussed.

FIG. 1 to FIG. 8 are a series of cross-sectional views illustrating a method for manufacturing the MEMS device 100 according to some embodiments of the present disclosure. It should be noted that, in order to more clearly show the features of the embodiments of the present disclosure, some components may be omitted in FIG. 1 to FIG. 8.

Referring to FIG. 1, firstly, a substrate 10 is provided. The substrate 10 may have at least one contact 12. In some embodiments, the substrate 10 may include silicon, but the present disclosure is not limited thereto. For example, in some other embodiments, the substrate 10 may include other elementary semiconductors (e.g., germanium). The substrate 10 may also include compound semiconductors (e.g., silicon carbide (SiC), gallium arsenic (GaAs), indium arsenide (InAs), or indium phosphide (InP)). The substrate 10 may further include alloy semiconductors (e.g., silicon germanium (SiGe), silicon germanium carbide (SiGeC), gallium arsenic phosphide (GaAsP), or gallium indium phosphide (GaInP)).

In some embodiments, the substrate 10 may include semiconductor-on-insulator (SOI), such as silicon-on-insulator or germanium-on-insulator. The semiconductor-on-insulator substrate may include a bottom substrate, a buried oxide layer disposed on the bottom substrate, and a semiconductor layer disposed on the buried oxide layer. In some embodiments, the substrate 10 may include single-crystal substrate, multi-layer substrate, any other applicable substrate, or a combination thereof, but the present disclosure is not limited thereto.

In some embodiments, the substrate 10 may include P-type dopants (e.g. boron, aluminum, gallium, indium, or thallium) or N-type dopant (e.g. arsenic, phosphorus, or antimony). The dopants may form a doped region in the substrate 10, and the doped region may, for example, form a part of the contact 12, but the present disclosure is not limited thereto. In some embodiments, the substrate 10 may be regarded as a chip of the MEMS device 100.

Referring to FIG. 1, then, a first dielectric layer 20 is formed on the substrate 10. In some embodiments, the material of the first dielectric layer 20 may include, for example, an oxide (e.g., silicon oxide), a nitride (e.g., silicon nitride), any other applicable material, or a combination thereof, but the present disclosure is not limited thereto. In some embodiments, the first dielectric layer 20 may be deposited on the substrate 10 through a deposition process. The deposition process may include metal organic chemical vapor phase deposition (MOCVD), atomic layer deposition (ALD), molecular beam epitaxy (MBE), liquid phase epitaxy (LPE), similar processes, or a combination thereof, but the present disclosure is not limited thereto.

Figure 2:
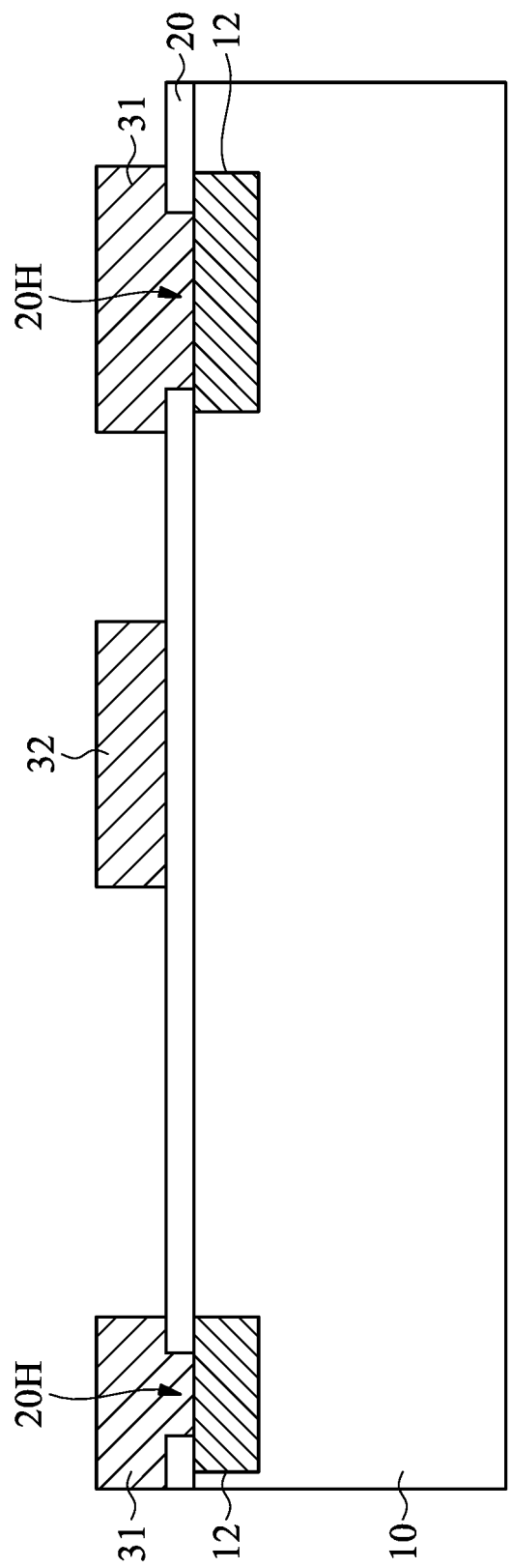
FIG. 2 is a cross-sectional view illustrating the MEMS device at one stage of manufacture according to some embodiments of the present disclosure.

Referring to FIG. 2, the first dielectric layer 20 has at least one through hole 20H. The through hole 20H may be disposed to correspond to the contact 12 and expose a portion of the top surface of the contact 12. A patterning process may be performed on the first dielectric layer 20 to form the through hole 20H. For example, a mask layer (not shown) may be provided on the first dielectric layer 20, and then the mask layer is used as an etching mask to perform an etching process to form the through hole 20H on the first dielectric layer 20. In some embodiments, the mask layer may include a photoresist, such as a positive photoresist or a negative photoresist. The mask layer may be a single-layer structure or a multi-layer structure. The formation of the mask layer may include a deposition process, a photolithography process, any other applicable process, or a combination thereof, but the present disclosure is not limited thereto.

In some embodiments, the deposition process may include spin-on coating, chemical vapor phase deposition (CVD), atomic layer deposition (ALD), similar processes, or a combination thereof. In some embodiments, the photolithography process may include photoresist coating (e.g., spin coating), soft baking, mask aligning, exposure, post-exposure baking (PEB), developing, rinsing, drying (e.g., hard baking), any other applicable process, or a combination thereof, but the present disclosure is not limited thereto.

In some embodiments, the etching process may include a dry etching process, a wet etching process, or a combination thereof. For example, the dry etching process may include a reactive ion etching (RIE), an inductively-coupled plasma (ICP) etching, a neutral beam etching (NBE), an electron cyclotron resonance (ECR) etching, similar processes, or a combination thereof, but the present disclosure is not limited thereto.

Referring to FIG. 2, then, a metal layer 30 is formed on the first dielectric layer 30, wherein at least a portion of the metal layer 30 is electrically connected to the contact 12. In particular, as shown in FIG. 2, the metal layer 30 may include a first portion 31 and a second portion 32. The first portion 31 may be in direct contact with the contact 12 through the through hole 20H of the first dielectric layer 20, and the second portion 32 may be separated from the contact 12 by the first dielectric layer 20. That is, the first portion 31 of the metal layer 30 may be electrically connected to the contact 12, and the second portion 32 of the metal layer 30 may be electrically isolated from the contact 12, but the present disclosure is not limited thereto. For example, the first portion 31 of the metal layer 30 may be used to electrically connect the contact 12 to a subsequent structure.

In some embodiments, the material of the metal layer 30 may include gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof, but the present disclosure is not limited thereto. In some embodiments, the metal material may be formed on the first dielectric layer 20 by physical vapor deposition (PVD), chemical vapor phase deposition (CVD), atomic layer deposition (ALD), evaporation, sputtering, similar processes, or a combination thereof, but the present disclosure is not limited thereto. Then, a patterning process may be performed on the metal material to form the first portion 31 and the second portion 32 of the metal layer 30. The example of the patterning process is as described above, so it will not be repeated here.

Figure 3:
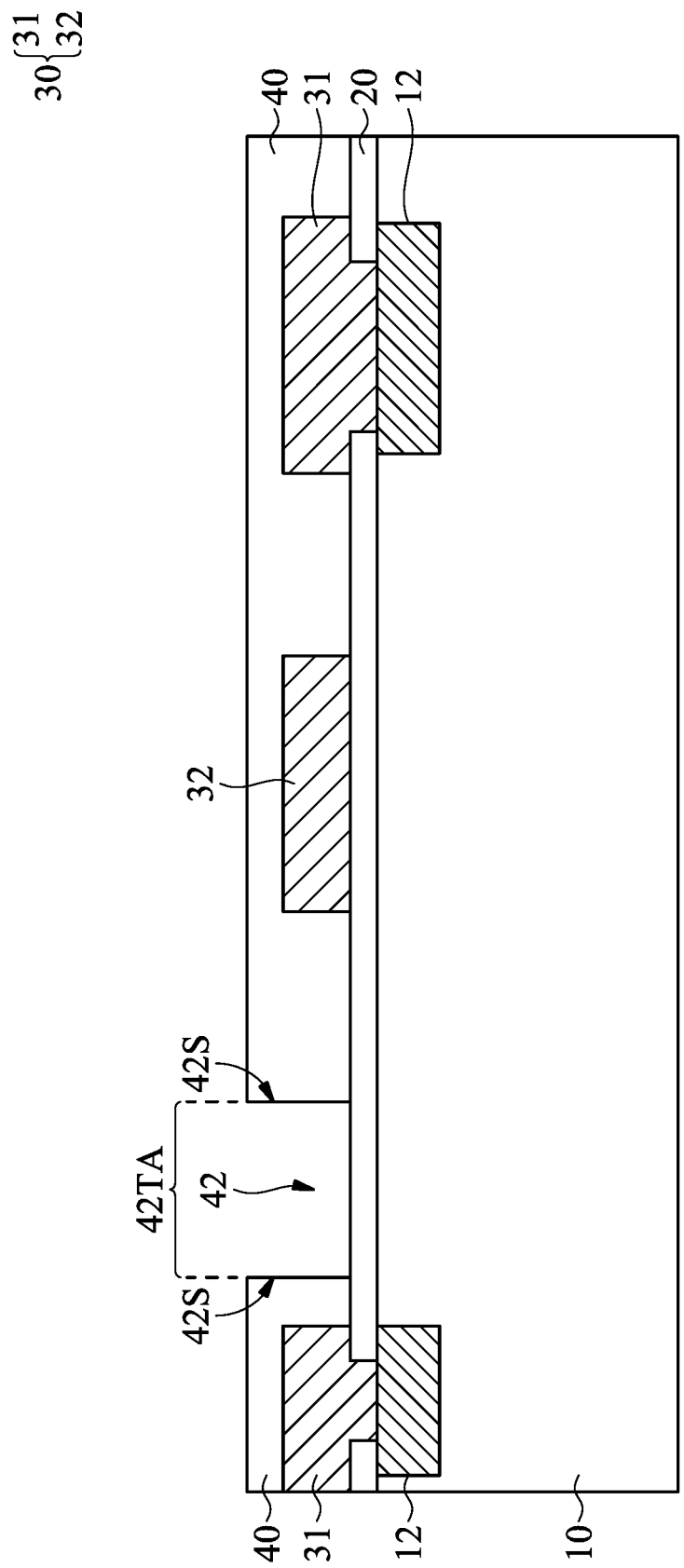
FIG. 3 is a cross-sectional view illustrating the MEMS device at one stage of manufacture according to some embodiments of the present disclosure.

Referring to FIG. 3, a second dielectric layer 40 is formed on the first dielectric layer 20 and the metal layer 30, and the second dielectric layer 40 has a recess structure 42. Similarly, the material of the second dielectric layer 40 may include, for example, an oxide (e.g., silicon oxide), a nitride (e.g., silicon nitride), any other applicable material, or a combination thereof, but the present disclosure is not limited thereto. In some embodiments, the material of the second dielectric layer 40 may be the same as or different from the material of the first dielectric layer 20, which may be determined according to actual needs. In some embodiments, the second dielectric layer 40 may be deposited on the first dielectric layer 20 and the metal layer 30 through a deposition process. The example of the deposition process is as described above, so it will not be repeated here. In addition, a patterning process may be performed on the second dielectric layer 40 to form the recess structure 42. For example, a mask layer (not shown) may be disposed on the second dielectric layer 40, and then the mask layer may be used as an etching mask to perform an etching process to form the recess structure 42. In some embodiments, the etching process may include a dry etching process, a wet etching process, or a combination thereof.

As shown in FIG. 3, in some embodiments, the recess structure 42 of the second dielectric layer 40 may expose a portion of the top surface of the first dielectric layer 20, but the present disclosure is not limited thereto. In some embodiments, the recess structure 42 may also be disposed over the first dielectric layer 20 and not expose the first dielectric layer 20; alternatively, the recess structure 42 may also expose a portion of the top surface of the second portion 32 of the metal layer 30, which may be determined according to actual needs.

In some embodiments, the sidewall 42S of the recess structure 42 may be substantially perpendicular to the top surfaces of the first dielectric layer 20 and the second dielectric layer 40, but the present disclosure is not limited thereto. In the embodiment shown in FIG. 3, the recess structure 42 may have a constant cross-sectional area. That is, the cross-sectional area of the recess structure 42 at different depths may be substantially the same as the cross-sectional area 42TA at the top of the recess structure 42, but the present disclosure is not limited thereto.

Figure 4:
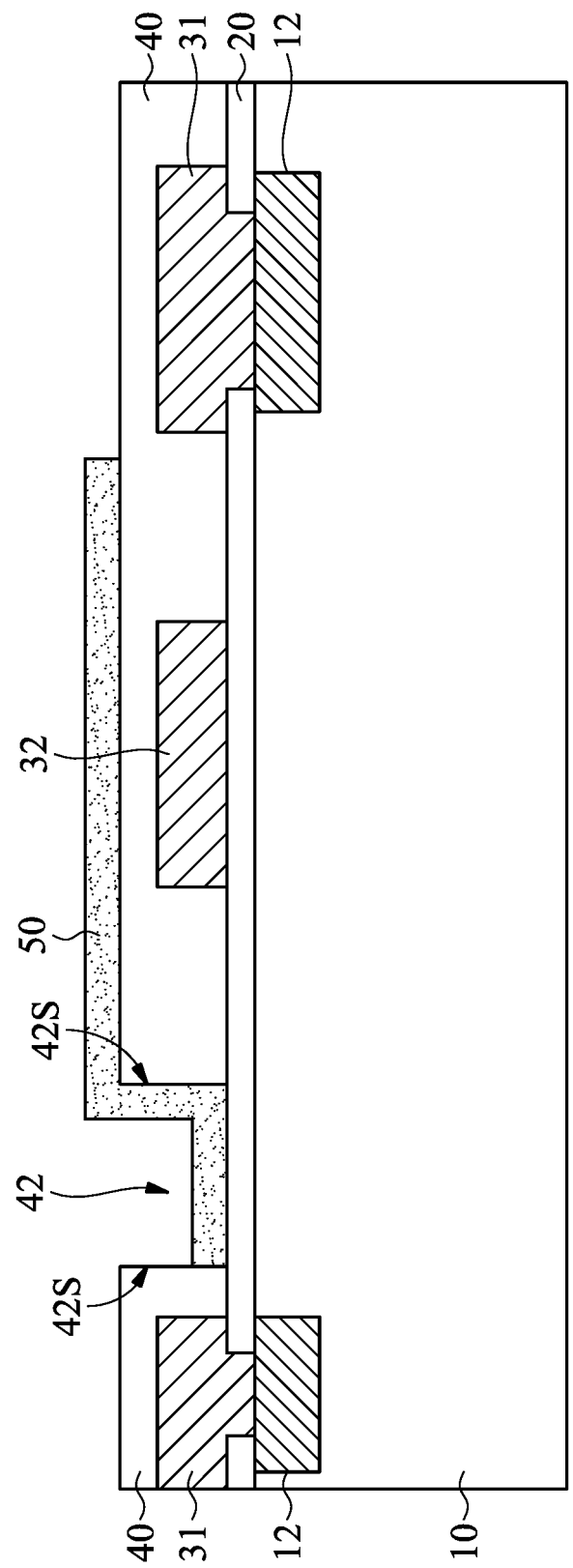
FIG. 4 is a cross-sectional view illustrating the MEMS device at one stage of manufacture according to some embodiments of the present disclosure.

Referring to FIG. 4, a sacrificial layer 50 is formed on the second dielectric layer 40 and in the recess structure 42. In particular, the sacrificial layer 50 may be formed on the bottom surface and a portion of the sidewall 42S of the recess structure 42 and a portion of the top surface of the second dielectric layer 40. In some embodiments, the material of the sacrificial layer 50 may include silicon oxide, photoresist, polyimide, germanium, any other applicable material, or a combination thereof, but the present disclosure is not limited thereto. In some embodiments, the sacrificial layer 50 and the first dielectric layer 20, the metal layer 30, and the second dielectric layer 40 may have a high etching selectivity. Therefore, during the subsequent process of removing the sacrificial layer 50, the first dielectric layer 20, the metal layer 30, and the second dielectric layer 40 may be prevented from being damaged. In some embodiments, the sacrificial layer 50 may be formed on the second dielectric layer 40 and in the recess structure 42 by a deposition process. The example of the deposition process is as described above, so it will not be repeated here.

Figure 5:
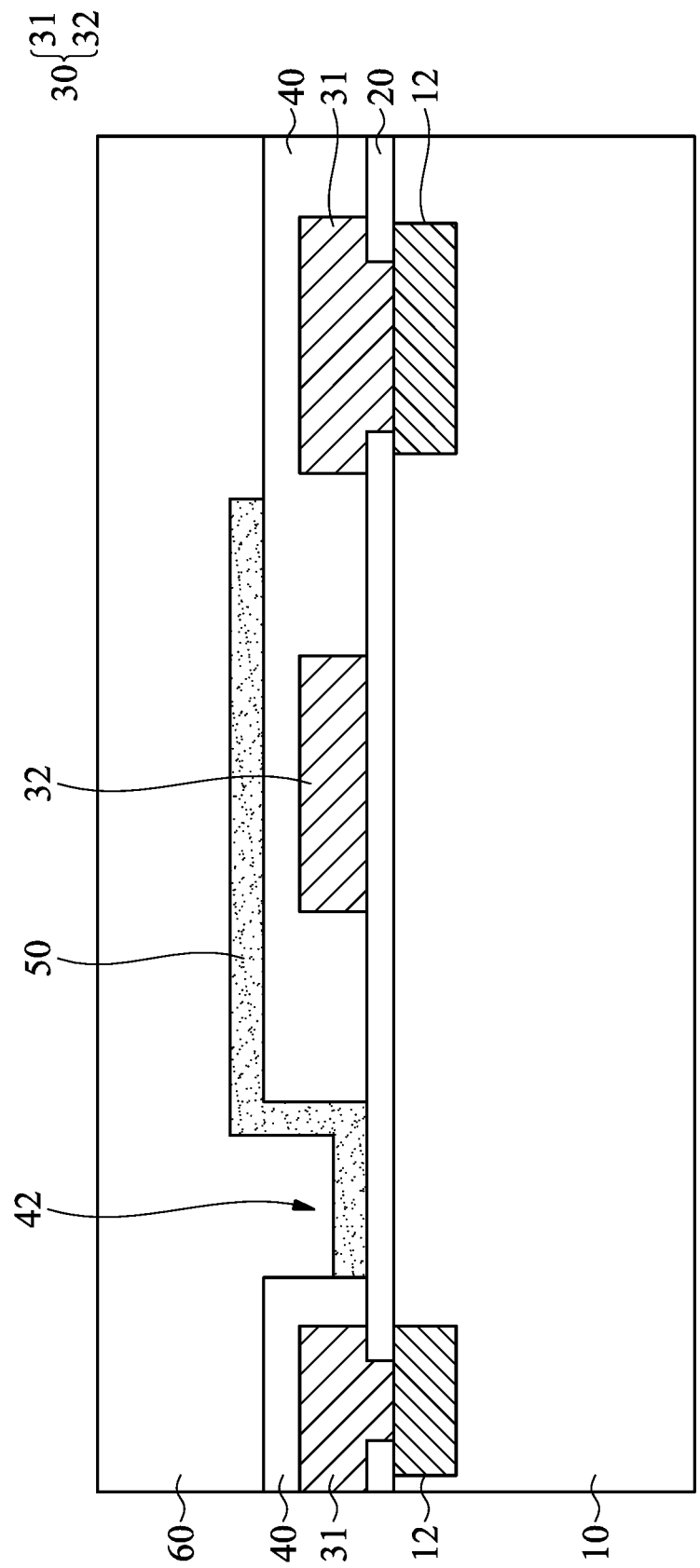
FIG. 5 is a cross-sectional view illustrating the MEMS device at one stage of manufacture according to some embodiments of the present disclosure.

Referring to FIG. 5, a structure layer 60 is formed on the second dielectric layer 40 and the sacrificial layer 50. In particular, the structure layer 60 may be formed on the top surface of the second dielectric layer 40 and the top surface of the sacrificial layer 50, and fills the remaining space of the recess structure 42. In some embodiments, the material of the structure layer 60 may include polycrystalline silicon, epitaxial silicon, silicon germanium, any other applicable semiconductor material, or a combination thereof, but the present disclosure is not limited thereto. In some embodiments, the structure layer 60 and the sacrificial layer 50 may also have a high etching selectivity. In some embodiments, the structure layer 60 may be formed on the second dielectric layer 40 and the sacrificial layer 50 and in the recess structure 42 by a deposition process. The example of the deposition process is as described above, so it will not be repeated here. In some embodiments, the structure layer 60 may be considered as part of a MEMS substrate.

Figure 6:
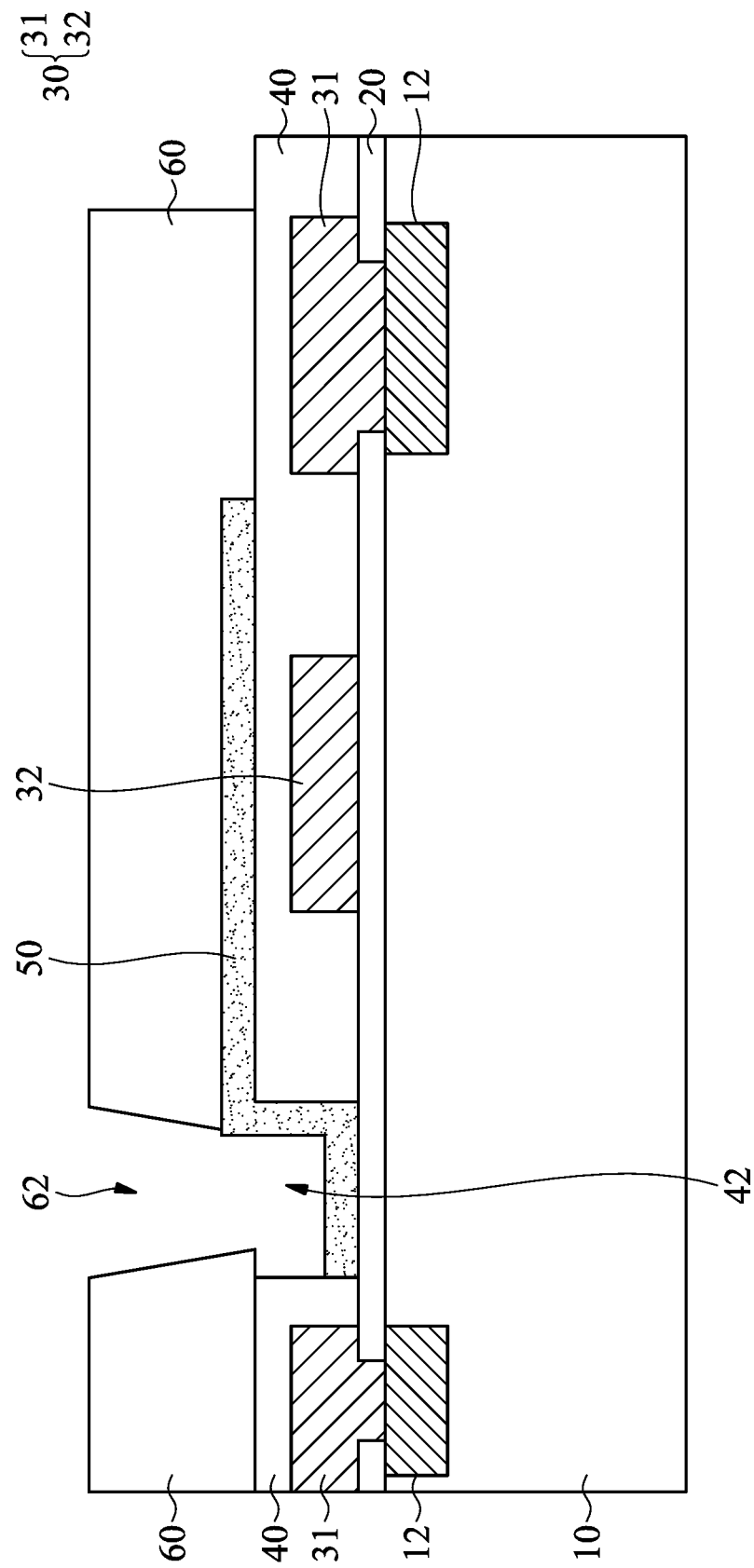
FIG. 6 is a cross-sectional view illustrating the MEMS device at one stage of manufacture according to some embodiments of the present disclosure.

Referring to FIG. 6, a portion of the structure layer 60 is removed to form an opening 62. In particular, the opening 62 corresponds to the recess structure 42 (i.e., the opening 62 is disposed over the recess structure 42), and the opening 62 may expose the sacrificial layer 50 in the recess structure 42. In some embodiments, a patterning process may be performed on the structure layer 60 to form the opening 62. For example, a mask layer (not shown) may be disposed on the structure layer 60, and then the mask layer may be used as an etching mask to perform a dry etching process to form the opening 62 in the structure layer 60. Here, the etching gas used in the dry etching process includes, for example, $CF_4$, $O_2$, $SF_6$, $C_4F_8$, Ar, $Cl_2$, $BCl_3$, any other applicable etching gases, or a combination thereof, but the present disclosure is not limited thereto.

Figure 7:
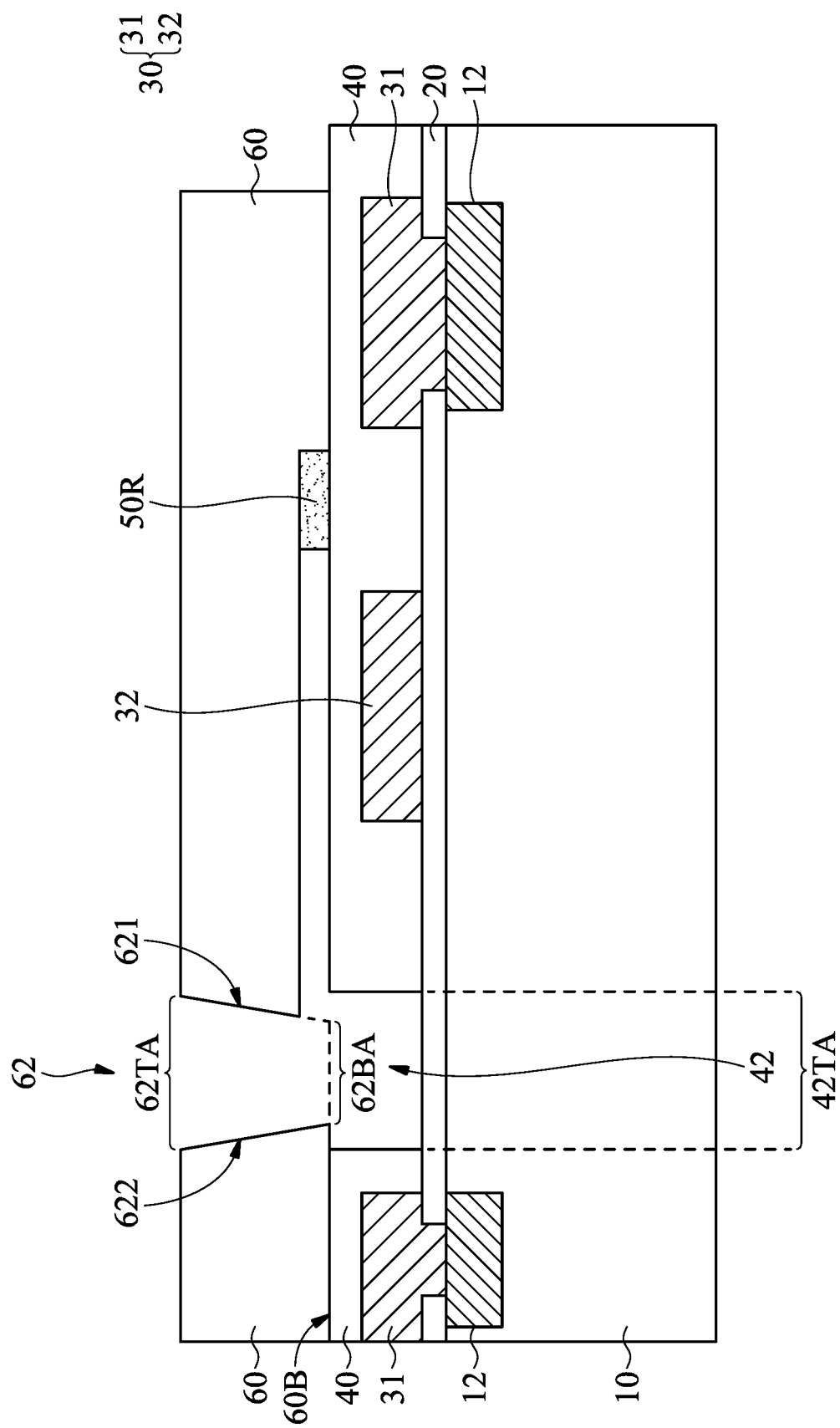
FIG. 7 is a cross-sectional view illustrating the MEMS device at one stage of manufacture according to some embodiments of the present disclosure.

Referring to FIG. 7, the sacrificial layer 50 is removed. In particular, the sacrificial layer 50 in the recess structure 42 and between the second dielectric layer 40 and the structure layer 60 is removed to expose the recess structure 42. For example, a wet etching process may be performed on the sacrificial layer 50 to remove the sacrificial layer 50. Here, the etching solution used in the wet etching process includes, for example, sulfuric acid ($H_2SO_4$), phosphoric acid ($H_3PO_4$), hydrofluoric acid (HF), hydrogen peroxide ($H_2O_2$), ammonia water ($NH_4OH$), etc., but the present disclosure is not limited thereto. Since the sacrificial layer 50 and the first dielectric layer 20, the metal layer 30, the second dielectric layer 40, and the structure layer 60 may have a high etching selectivity, the first dielectric layer 20, the metal layer 30, the second dielectric layer 40, and the structure layer 60 may be prevented from being damaged during the process of removing the sacrificial layer 50. In some embodiments, part of the sacrificial layer 50 may be retained. For example, as shown in FIG. 7, the retained sacrificial layer 50 may be regarded as a remaining portion of sacrificial layer 50R, and the remaining portion of sacrificial layer 50R is disposed between the second dielectric layer 40 and the structure layer 60, but the present disclosure is not limited thereto. In some other embodiments, the sacrificial layer 50 may be completely removed.

As shown in FIG. 7, in some embodiments, the cross-sectional area 62BA at the bottom of the opening 62 is smaller than the cross-sectional area 42TA at the top of the recess structure 42. Since the sacrificial layer 50 may occupy part of the space between the second dielectric layer 40 and the structure layer 60 in the foregoing steps, after the sacrificial layer 50 is removed, the bottommost of the sidewall 621 and the bottommost of the sidewall 622 of the opening 62 are not on the same plane. Here, the bottom surface 60B of the structure layer 60 is extended, and the sidewall 621 of the opening 62 is extended, and the cross-sectional area of the bottommost of the space formed by the two extension surfaces and the sidewall 622 of the opening 62 may be defined as the cross-sectional area 62BA at the bottom of the opening 62 (as shown in FIG. 7).

As shown in FIG. 7, in some embodiments, the cross-sectional area 62BA at the bottom of the opening 62 is smaller than the cross-sectional area 62TA at the top of the opening 62. In particular, the cross-sectional areas of the openings 62 at different depths are not constant and may be continuously changed. For example, as shown in FIG. 7, in cross-sectional areas of the openings 62 at this stage, the sidewall 621 and the sidewall 622 of the opening 62 may be presented as two inclined surfaces, but the present disclosure is not limited thereto.

Figure 8:
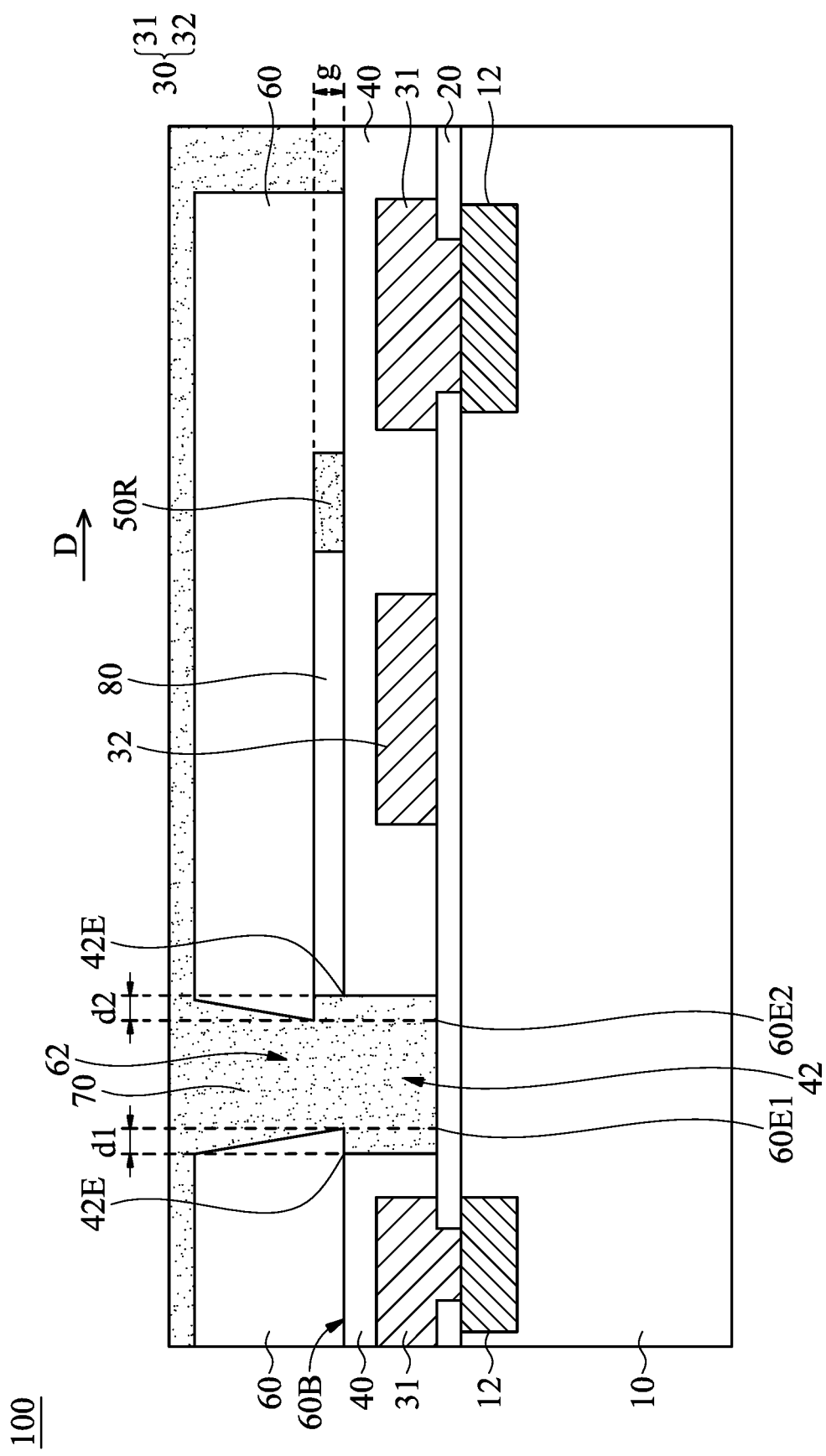
FIG. 8 is a cross-sectional view illustrating the MEMS device at one stage of manufacture according to some embodiments of the present disclosure.

Referring to FIG. 8, a packaging layer 70 is formed to form the MEMS device 100. In particular, at least a portion of the packaging layer 70 may be formed in the opening 62 and the recess structure 42. That is, the packaging layer 70 may be continuously formed and fill the space in which the opening 62 and the recess structure 42 are located, so that the second dielectric layer 40, the structure layer 60, and the packaging layer 70 may define a chamber 80. In other words, the chamber 80 may partially or completely replace the space occupied by the original sacrificial layer 50 between the second dielectric layer 40 and the structure layer 60. That is, the chamber 80 is between the second dielectric layer 40, the structure layer 60, and the packaging layer 70. In addition, as shown in FIG. 8, in some embodiments, the chamber 80 may be between the second dielectric layer 40, the remaining portion of sacrificial layer 50R, the structure layer 60, and the packaging layer 70. Therefore, the height g of the chamber 80 may be substantially equal to the thickness of the remaining portion of sacrificial layer 50R.

In some embodiments, the material of the packaging layer 70 may include silicon oxide, silicon nitride, photoresist, polyimide, any other applicable material, or a combination thereof, but the present disclosure is not limited thereto. In some embodiments, the packaging layer 70 may be formed in the opening 62 and the recess structure 42 by a deposition process. The example of the deposition process is as described above, so it will not be repeated here. Here, the packaging layer 70 may be regarded as the sealing structure of the MEMS device 100. In addition, as shown in FIG. 8, part of the packaging layer 70 may be formed on the structure layer 60, but the present disclosure is not limited thereto.

As shown in FIG. 8, in some embodiments, the recess structure 42 exposes a portion of the top surface of the first dielectric layer 20, so that the packaging layer 70 may be in direct contact with the first dielectric layer 20, but the present disclosure is not limited thereto. In some other embodiments, the recess structure 42 may be disposed over the first dielectric layer 20 and not expose the first dielectric layer 20, so that the packaging layer 70 may be in direct contact with the second dielectric layer 40.

In a general MEMS device that does not have a recess structure, since the formation (deposition) speed of the portion corresponding to the center of the opening 62 is greater than the formation (deposition) speed of the portion away from the center of the opening 62 during the process of forming (depositing) the packaging layer 70, it is easy to form a sealing seam. In contrast, since the MEMS device 100 in the embodiment of the present disclosure includes the recess structure 42 corresponding to the opening 62, it is possible to effectively prevent the generation of the sealing seam.

Moreover, in some embodiments of the present disclosure, since the cross-sectional area 62BA at the bottom of the opening 62 is smaller than the cross-sectional area 62TA at the top of the opening 62, the packaging layer 70 may be formed in the opening 62 more uniformly, thereby avoiding the hollow structure caused by the early closing of the recess structure 42 and the opening 62 before the packaging layer 70 has been filled.

Therefore, in the MEMS device 100 according to some embodiments of the present disclosure, by providing the recess structure 42 in the second dielectric layer 42 and the opening 62 corresponding to the recess structure 42 in the structure layer 60, the packaging layer 70 (i.e., a structure for sealing holes) may be continuously and uniformly filled into the opening 62 and the recess structure 42 to complete sealing. That is, the MEMS device 100 and the manufacturing method thereof according to the embodiments of the present disclosure may effectively prevent the generation of sealing seams and hollow structures, thereby improving sealing quality and enhancing overall stability of the MEMS device 100. In addition, no complicated process is required, which may effectively shorten the process time and reduce costs.

As shown in FIG. 8, in some embodiments, the projection of the structure layer 60 on the bottom surface of the recess structure 42 has an end portion 60E1 (or 60E2) corresponding to the opening 62, and the shortest distance d1 (or d2) between the end portion 60E1 (or 60E2) and the top 42E of the recess structure 42 in the direction D parallel with the top surface of the second dielectric layer 40 (or the bottom surface 60B of the structure layer 60) is larger than or equal to the thickness of the sacrificial layer 50 (or the thickness of the remaining portion of sacrificial layer 50R) (i.e., the height g of the chamber 80), but the present disclosure is not limited thereto. In the embodiments of the present disclosure, the shortest distance d1 (or d2) between the end portion 60E1 (or 60E2) and the top 42E of the recess structure 42 in the direction D parallel with the top surface of the second dielectric layer 40 (or the bottom surface 60B of the structure layer 60) may be adjusted according to the depth of the recess structure 42, which is not described in detail here.

Figure 9:
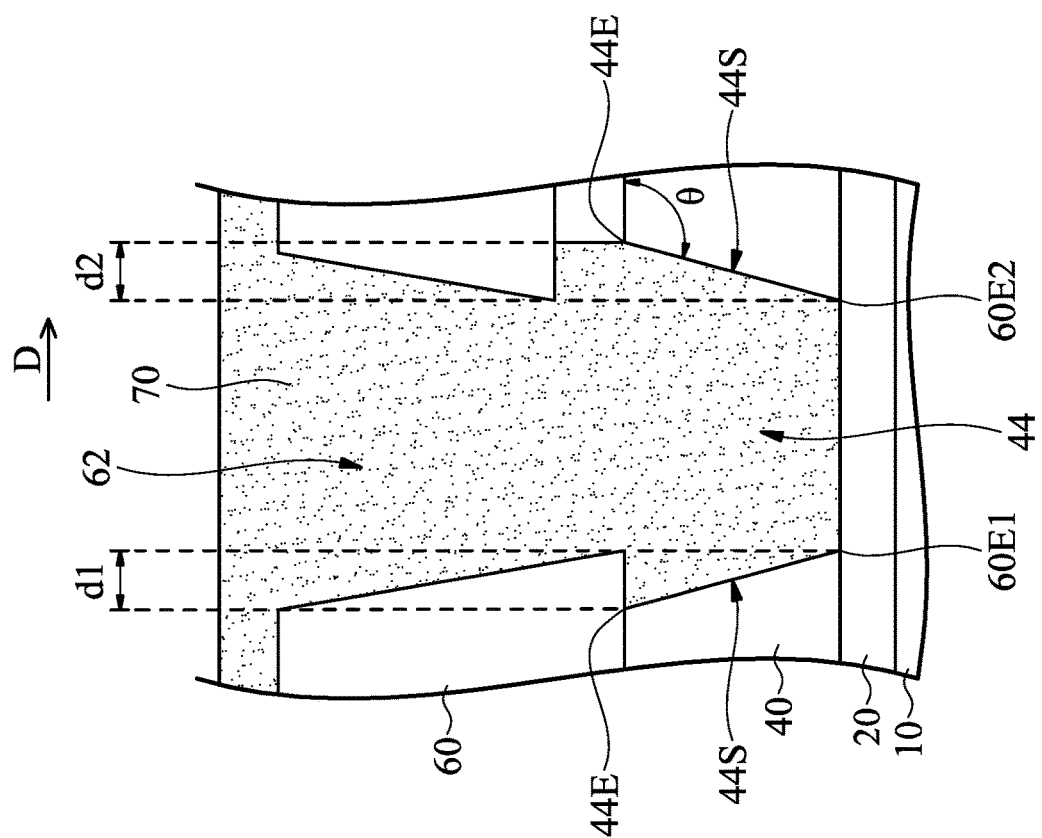
FIG. 9 is a cross-sectional view of the recess structure according to another embodiment of the present disclosure.

In the foregoing embodiment, the sidewall 42S of the recess structure 42 is substantially perpendicular to the top surfaces of the first dielectric layer 20 and the second dielectric layer 40, but the disclosure is not limited thereto. FIG. 9 is a cross-sectional view of the recess structure 44 according to another embodiment of the present disclosure. Moreover, in order to more clearly show the features of the recess structure 44, other components adjacent to the recess structure 44 are also shown in FIG. 9.

Referring to FIG. 9, the sidewall 44S of the recess structure 44 is not perpendicular to the top surface of the second dielectric layer 40. In some embodiments, the included angle θ between the top surface of the second dielectric layer 40 and the sidewall 44S of the recess structure 44 may be between 90 and 150 degrees, but the present disclosure is not limited thereto. When the included angle θ between the top surface of the second dielectric layer 40 and the sidewall 44S of the recess structure 44 is 90, the sidewall 44S of the recess structure 44 is substantially perpendicular to the top surfaces of the second dielectric layer 40.

Similarly, the projection of the structure layer 60 on the bottom surface of the recess structure 44 has an end portion 60E1 (or 60E2) corresponding to the opening 62, and the shortest distance d1 (or d2) between the end portion 60E1 (or 60E2) and the top 44E of the recess structure 42 in the direction D parallel with the top surface of the second dielectric layer 40 is larger than or equal to the thickness of the sacrificial layer 50 (or the thickness of the remaining portion of sacrificial layer 50R) (i.e., the height g of the chamber 80), which is not described in detail here.

Figure 10:
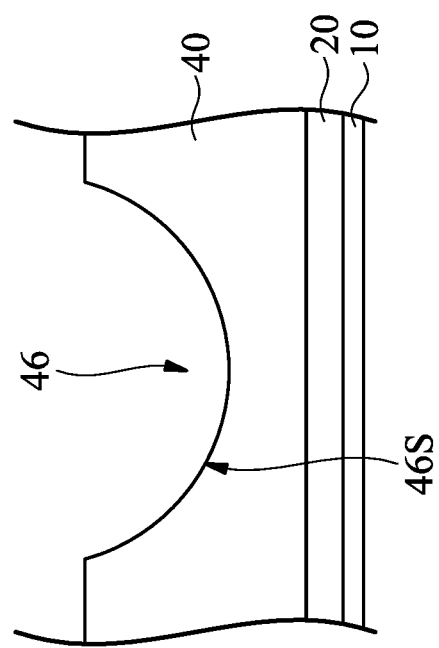
FIG. 10 is a cross-sectional view of the recess structure according to still another embodiment of the present disclosure.

FIG. 10 is a cross-sectional view of the recess structure 46 according to still another embodiment of the present disclosure. Referring to FIG. 10, the sidewall 46S of the recess structure 46 may be curved. The embodiments of FIG. 9 and FIG. 10 illustrate different examples of the recess structure of some embodiments of the present disclosure, but the recess structure of the embodiments of the present disclosure may also be formed into other different shapes, which may be determined according to actual needs.

Figure 11:
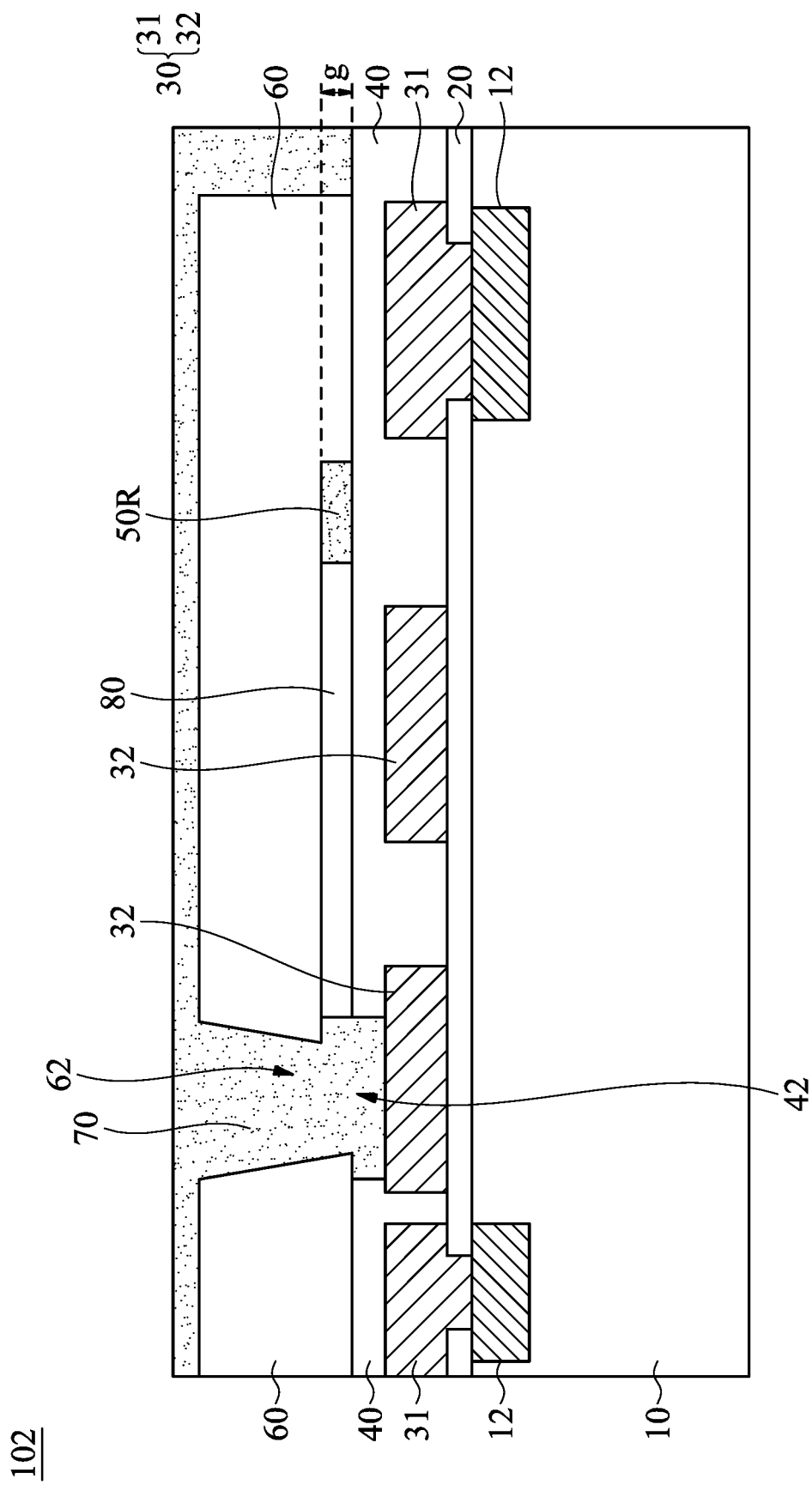
FIG. 11 is a cross-sectional view of the MEMS device according to some embodiments of the present disclosure.

FIG. 11 is a cross-sectional view of the MEMS device 102 according to some embodiments of the present disclosure. The structure and manufacturing method of the MEMS device 102 shown in FIG. 11 are similar to the MEMS device 100 shown in FIG. 8, and the difference is that the recess structure 42 of the MEMS device 102 exposes part of the top surface of the second portion 32 of the metal layer 30, so that the packaging layer 70 may be in direct contact with part of the metal layer 30 (i.e., the second portion 32 of the metal layer 30), but the present disclosure is not limited thereto.

In summary, in some embodiments of the present disclosure, by providing the recess structure in the second dielectric layer and the opening corresponding to the recess structure in the structure layer, the packaging layer (i.e., a structure for sealing holes) may be continuously and uniformly filled into the opening and the recess structure to complete sealing. Moreover, the MEMS device and the manufacturing method thereof according to the embodiments of the present disclosure may effectively prevent the generation of sealing seams and hollow structures, thereby improving sealing quality and enhancing overall stability. Furthermore, no complicated process is required, which may effectively shorten the process time and reduce costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:
1. A MEMS device, comprising:
a substrate having at least one contact;
a first dielectric layer disposed on the substrate;
at least one metal layer disposed on the first dielectric layer, and at least a portion of the metal layer electrically connected to the contact;
a second dielectric layer disposed on the first dielectric layer and the metal layer and having a recess structure;
a structure layer disposed on the second dielectric layer and having an opening, wherein the opening is disposed to correspond to the recess structure, and a cross-sectional area at a bottom of the opening is smaller than a cross-sectional area at a top of the recess structure;

a packaging layer, wherein at least a portion of the packaging layer is disposed in the opening and the recess structure, wherein the second dielectric layer, the structure layer, and the packaging layer define a chamber.

2. The MEMS device according to claim 1, wherein the cross-sectional area at the bottom of the opening is smaller than a cross-sectional area at a top of the opening.

3. The MEMS device according to claim 2, wherein the packaging layer is in direct contact with the first dielectric layer or the second dielectric layer.

4. The MEMS device according to claim 2, further comprising:
a remaining portion of sacrificial layer disposed between the second dielectric layer and the structure layer,
wherein the chamber is disposed between the second dielectric layer, the remaining portion of sacrificial layer, the structure layer, and the packaging layer.

5. The MEMS device according to claim 4, wherein a projection of the structure layer on a bottom surface of the recess structure has an end portion corresponding to the opening, and a shortest distance between the end portion and the top of the recess structure in a direction parallel with a top surface of the second dielectric layer is larger than or equal to a thickness of the remaining portion of sacrificial layer in another direction perpendicular to the top surface of the second dielectric layer.

6. The MEMS device according to claim 2, wherein an included angle between a top surface of the second dielectric layer and a sidewall of the recess structure is between 90 and 150 degrees.

7. The MEMS device according to claim 2, wherein a sidewall of the recess structure is curved.

8. The MEMS device according to claim 2, wherein the metal layer comprises a first portion electrically connected to the contact, and a second portion electrically isolated from the contact.

9. The MEMS device according to claim 8, wherein the packaging layer is in direct contact with the second portion.

10. The MEMS device according to claim 1, wherein a portion of the packaging layer is disposed on the structure layer.

11. A manufacturing method of a MEMS device, comprising:
providing a substrate having at least one contact;
forming a first dielectric layer on the substrate, wherein the first dielectric layer has at least one through hole exposing a portion of a top surface of the contact;
forming at least one metal layer on the first dielectric layer, wherein at least a portion of the metal layer is electrically connected to the contact;
forming a second dielectric layer on the first dielectric layer and the metal layer, wherein the second dielectric layer has a recess structure;
forming a sacrificial layer on the second dielectric layer and in the recess structure;
forming a structure layer on the second dielectric layer and the sacrificial layer;
removing a portion of the structure layer to form an opening, wherein the opening exposes the sacrificial layer in the recess structure;
removing the sacrificial layer to expose the recess structure, wherein a cross-sectional area at a bottom of the opening is smaller than a cross-sectional area at a top of the recess structure; and
forming a packaging layer, wherein at least a portion of the packaging layer is formed in the opening and the recess structure, and the second dielectric layer, the structure layer, and the packaging layer define a chamber.

12. The manufacturing method of the MEMS device according to claim 11, wherein the cross-sectional area at the bottom of the opening is smaller than a cross-sectional area at a top of the opening.

13. The manufacturing method of the MEMS device according to claim 12, wherein the packaging layer is in direct contact with the first dielectric layer or the second dielectric layer.

14. The manufacturing method of the MEMS device according to claim 12, wherein a projection of the structure layer on a bottom surface of the recess structure has an end portion corresponding to the opening, and a shortest distance between the end portion and the top of the recess structure in a direction parallel with a top surface of the second dielectric layer is larger than or equal to a thickness of the sacrificial layer in another direction perpendicular to the top surface of the second dielectric layer.

15. The manufacturing method of the MEMS device according to claim 12, wherein an included angle between a top surface of the second dielectric layer and a sidewall of the recess structure is between 90 and 150 degrees.

16. The manufacturing method of the MEMS device according to claim 12, wherein a sidewall of the recess structure is curved.

17. The manufacturing method of the MEMS device according to claim 11, wherein in the step of forming the second dielectric layer, the recess structure of the second dielectric layer exposes a portion of a top surface of the metal layer.

18. The manufacturing method of the MEMS device according to claim 17, wherein the metal layer comprises a first portion electrically connected to the contact, and a second portion electrically isolated from the contact.

19. The manufacturing method of the MEMS device according to claim 18, wherein the packaging layer is in direct contact with the second portion.

* * * * *